(12) United States Patent
Chmelar

(10) Patent No.: US 7,656,339 B2
(45) Date of Patent: Feb. 2, 2010

(54) SYSTEMS AND METHODS FOR ANALOG TO DIGITAL CONVERSION

(75) Inventor: Erik Chmelar, Midland, MI (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/134,488

(22) Filed: Jun. 6, 2008

(65) Prior Publication Data

US 2009/0303096 A1 Dec. 10, 2009

(51) Int. Cl.
*H03M 1/36* (2006.01)
(52) U.S. Cl. .................................. 341/159; 341/155
(58) Field of Classification Search .................. 341/155, 341/159
See application file for complete search history.

(56) References Cited

U.S. PATENT DOCUMENTS

| | | | |
|---|---|---|---|
| 5,072,221 A | | 12/1991 | Schmidt |
| 5,272,701 A | | 12/1993 | Tsuroka |
| 5,296,856 A | * | 3/1994 | Mantong ............... 341/139 |
| 5,861,829 A | | 1/1999 | Sutardja |
| 6,002,356 A | * | 12/1999 | Cooper ............... 341/160 |
| 6,081,219 A | * | 6/2000 | Prasanna ............... 341/159 |
| 6,373,423 B1 | * | 4/2002 | Knudsen ............... 341/159 |
| 7,333,580 B2 | | 5/2002 | Parhi |
| 6,404,372 B1 | * | 6/2002 | Heithoff ............... 341/155 |
| 6,717,945 B1 | | 4/2004 | Jue et al. |
| 6,744,432 B1 | | 6/2004 | Morein |
| 6,816,101 B2 | | 11/2004 | Hietala et al. |
| 7,262,724 B2 | * | 8/2007 | Hughes et al. ............... 341/139 |
| 2002/0186776 A1 | | 12/2002 | Cosand |
| 2008/0048896 A1 | | 2/2008 | Parthasarthy et al. |

OTHER PUBLICATIONS

Mangelsdorf, C.W., "A 400-MHz input flash converter with error correction", IEEE Journal of Solid-State Circuits, pp. 184-191, Feb. 1990, vol. 25 Issue: 1.

Katsuria, S. et. al., "Techniques for High-Speed Implementation of Nonlinear Cancellation", IEEE Joun. Communications, vol. 9, No. 5, Jun. 1991, pp. 711-717.

* cited by examiner

Primary Examiner—Khai M Nguyen
(74) Attorney, Agent, or Firm—Hamilton, DeSanctis & Cha

(57) ABSTRACT

Various embodiments of the present invention provide systems and methods for analog to digital conversion. For example, an analog to digital converter is disclosed that includes an analog input that is provided to a comparator bank. The comparator bank receives a reference indicator, and is operable to provide a current output based at least in part on a comparison of the analog input with a reference threshold corresponding to the reference indicator. The analog to digital converter further includes a range selection filter that is operable to receive the current output and to generate the reference indicator based at least in part on a prior output of the comparator bank.

26 Claims, 6 Drawing Sheets

SYSTEMS AND METHODS FOR ANALOG TO DIGITAL CONVERSION

BACKGROUND OF THE INVENTION

The present inventions are related to systems and methods for converting signals from one domain to another, and more particularly to systems and methods for converting an analog signal to a digital signal.

Analog to digital converters are used in a number of semiconductor devices to convert an analog electrical signal to a digital representation thereof. In the conversion process, a continuous analog signal is converted to a series of discrete or quantized digital values representing the analog signal at defined sample times. Simple analog to digital converters operate over a specified, static range of operation typically defined to encompass an expected analog input signal. FIG. 1 depicts an exemplary prior art flash analog to digital converter 100. Flash analog to digital converter 100 includes a comparator bank 120 including a number of comparators 121, 122, 123, 124, 125 that each receive a respective reference threshold (i.e., ref(n−1), ref(n−2), ref(3), ref(2) and ref(1)). In addition, each of comparators 121, 122, 123, 124, 125 receives an analog input 105, and compares analog input 105 to the respective reference threshold. The reference thresholds are chosen such that the combined output of comparator bank 120 is a thermometer code indicated as a digital output 170. When operating properly, digital output 170 includes an uninterrupted series of 0s followed by an uninterrupted series of 1s with the transition between 0s and 1s indicating the level of analog input 105 (i.e., a thermometer code without bubbles). In some cases, digital output 170 is provided to an encoder 180 that provides an encoded output 190 that may be more compact than a thermometer code.

In such a flash analog to digital converter, increased resolution is provided by reducing the level difference between successive reference voltages. Where the range of analog to digital converter 100 is to be maintained constant, increasing resolution requires a corresponding increase in the number of comparators. This has at least two disadvantages. First, additional comparators increase power and area consumption. Second, noise on analog input 105 and process differences in comparators 121, 122, 123, 124, 125 often results in production of an imperfect thermometer code (i.e., a thermometer code exhibiting bubbles) where the difference between successive reference voltages becomes small. Consequently, to compensate for the imperfections in the thermometer code, the complexity of encoder 180 increases substantially. This results in additional undesirable power and area costs.

Hence, for at least the aforementioned reasons, there exists a need in the art for advanced systems and methods for converting an analog signal to a digital signal.

BRIEF SUMMARY OF THE INVENTION

The present inventions are related to systems and methods for converting signals from one domain to another, and more particularly to systems and methods for converting an analog signal to a digital signal.

Various embodiments of the present invention provide analog to digital conversion circuits. Such circuits include an analog input that is provided to a comparator bank. The comparator bank receives a reference indicator, and is operable to provide a current output based at least in part on a comparison of the analog input with a reference threshold corresponding to the reference indicator. As the term "current output" is used in the claims, it designates an output that occurs at some point after a prior output. The circuits further include a range selection filter that is operable to receive the current output and to generate the reference indicator based at least in part on a prior output of the comparator bank.

In some instances of the aforementioned embodiments, the comparator bank includes a single comparator. In such instances, the reference indicator may be a voltage offset, and the reference threshold is a reference voltage plus the voltage offset. In particular cases, the reference voltage is zero.

In other instances of the aforementioned embodiments, the comparator bank includes at least a first comparator associated with a first reference threshold and a second comparator associated with a second reference threshold. In such instances, the reference indicator may be a selector that selects comparison of the analog input with the first reference threshold by the first comparator during a first bit period and selects comparison of the analog input with the second reference threshold by the second comparator during a second bit period. In such cases, the current output corresponds to the output of the first comparator during the first bit period and corresponds to the output of the second comparator during the second bit period.

In various instances of the aforementioned embodiments, the range selection filter includes a storage device for storing the prior output of the comparator bank, and an adjustment calculation circuit that receives prior output and calculates an adjustment factor based at least in part on the prior output. In particular instances, the adjustment factor includes the prior output multiplied by an inter-symbol interference value corresponding to a bit period of the prior output. In some cases, multiple prior outputs and/or succeeding outputs are multiplied by corresponding inter-symbol interference values, and the resulting products are summed to create the adjustment factor.

Other embodiments of the present invention provide methods for analog to digital conversion. The methods include receiving an analog input at a comparator bank, and comparing the analog input with a first reference threshold during a first bit period. A second reference threshold is determined based at least in part on a result of comparing the analog input with the first reference threshold, and the analog input is compared with the second reference threshold during a second bit period.

In some instances of the aforementioned methods, determining the second reference threshold includes multiplying the result of comparing the analog input with the first reference threshold by an inter-symbol interference value corresponding to the first bit period. In particular cases, multiplying the result of comparing the analog input with the first reference threshold by the inter-symbol interference value corresponding to the first bit period is done by looking up a pre-computed value in a lookup table.

In other instances of the aforementioned methods, the methods further include determining a third reference threshold based at least in part on the result of comparing the analog input with the first reference threshold and the result of comparing the analog input with the second reference threshold. In such instances, determining the third reference threshold may includes: multiplying the result of comparing the analog input with the first reference threshold by an inter-symbol interference value corresponding to the first bit period to generate a first product; multiplying the result of comparing the analog input with the second reference threshold by an inter-symbol interference value corresponding to the second bit period to generate a second product; and summing the first product and the second product. The analog input is compared with the third reference threshold. In some such instances, the multiplication and summing processes are performed using a lookup table including pre-computed values.

Yet other embodiments of the present invention provide communication systems. Such communication systems include a receiver with an analog to digital converter. The analog to digital converter includes: a comparator bank and a range selection filter. The comparator bank receives a reference indicator and an analog input, and is operable to provide a current output based at least in part on a comparison of the analog input with a reference threshold corresponding to the reference indicator. The range selection filter is operable to receive the current output and to generate the reference indicator. The reference indicator is generated at least in part based on a prior output of the comparator bank. In some instances of the aforementioned embodiments, the analog to digital converter is a physical reference level shifting analog to digital converter, and the reference indicator is a voltage offset. In other instances of the aforementioned embodiments, the analog to digital converter is a virtual reference level shifting analog to digital converter. In such instances, the comparator bank includes at least a first comparator associated with a first reference threshold and a second comparator associated with a second reference threshold. The reference indicator may be a selector that selects comparison of the analog input with the first reference threshold by the first comparator during a first bit period and selects comparison of the analog input with the second reference threshold by the second comparator during a second bit period. In such instances, the current output corresponds to the output of the first comparator during the first bit period and corresponds to the output of the second comparator during the second bit period.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 3b is a timing diagram depicting an exemplary operation of the dynamic analog to digital converter of FIG. 3a;

DETAILED DESCRIPTION OF THE INVENTION

The present inventions are related to systems and methods for converting signals from one domain to another, and more particularly to systems and methods for converting an analog signal to a digital signal.

Figure 2A:
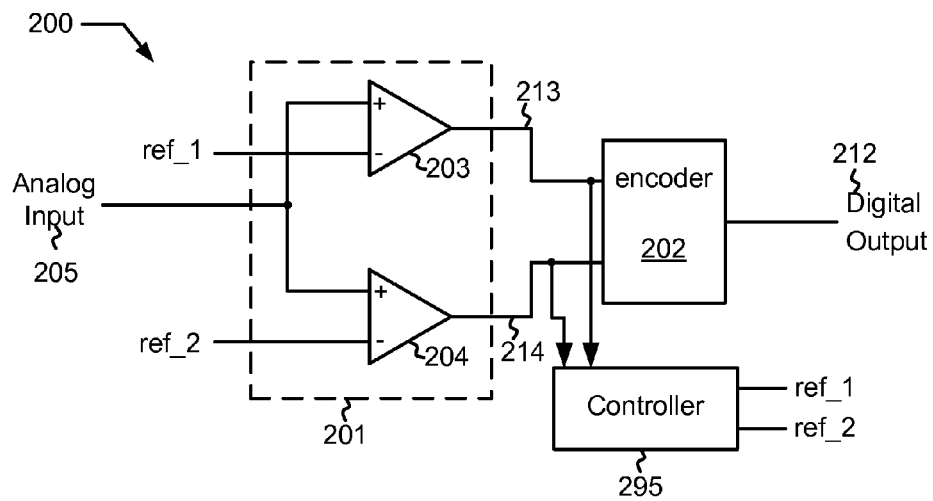
FIG. 2a depicts a dynamic analog to digital converter that may be used in relation to different embodiments of the present invention is depicted.

Turning to FIG. 2a, a dynamic analog to digital converter 200 that may be used in relation to one or more embodiments of the present invention is depicted. Dynamic analog to digital converter 200 is described in greater detail in U.S. patent application Ser. No. 12/108,791 entitled "Analog-To-Digital Converter" and filed Apr. 24, 2008 by Chmelar et al. The aforementioned application is assigned to an entity common hereto, and is incorporated herein by reference for all purposes. Dynamic analog to digital converter 200 includes a comparator bank 201 with an upper comparator 203 and a lower comparator 204. An upper voltage reference (ref_1) and an analog input 205 are compared by upper comparator 203 resulting in a binary output 213, and a lower voltage reference (ref_2) and analog input 205 are compared by lower comparator 204 resulting in a binary output 214. Output 213 and output 214 are provided to an encoder 202 that in turn provides a digital output 212. As described below in relation to FIG. 2b, a controller 295 dynamically adjusts ref_1 and ref_2 to track analog input 205 based on outputs 213, 214. The following pseudocode represents the operation of comparator bank 201:

```
If ((Output 213='1') && (Output 214='1'))
{
   ref_1=ref_1-step;
   ref_2=ref_2-step
}
Else If ((Output 213='0') && Output 214='1'))
{
   ref_1=ref_1;
   ref_2=ref_2
}
Else If ((Output 213='0') && Output 214='0'))
{
   ref_1=ref_1+step;
   ref_2=ref_2+step
}
```

Figure 2B:
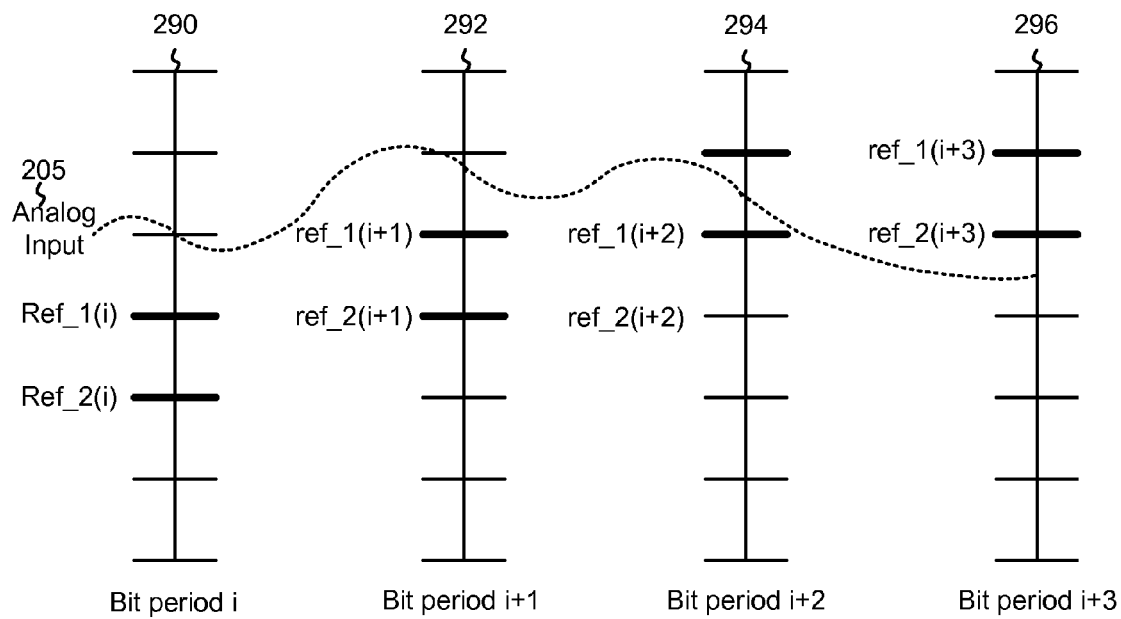
FIG. 2b depicts an exemplary series of comparisons performed using the dynamic analog to digital converter of FIG. 2.

Turning to FIG. 2b, an exemplary series of four consecutive samples 290, 292, 294, 296 are depicted to show the process of adjusting reference voltages (i.e., ref_1 and ref_2) by controller 205 to match analog input 205 (depicted as a dashed line). In the first sample 290, analog input 205 is higher than both ref_1 and ref_2 during a bit period i. In this case, the combination of output 213 and output 214 is '00' indicating to controller 295 that ref_1 and ref_2 are to be increased for the next sample. In the next sample 292, analog input analog input 205 is higher than both ref_1 and ref_2 during a bit period i+1. Again, the combination of output 213 and output 214 is '00' indicating to controller 295 that ref_1 and ref_2 are to be increased for the next sample. In the third sample 294, analog input analog input 205 falls between ref_1 and ref_2 during a bit period i+2. In this case, the combination of output 213 and output 214 is '01' indicating to controller 295 that ref_1 and ref_2 are to be maintained for the next sample. In the fourth sample 296, analog input 205 is lower than both ref_1 and ref_2 during a bit period i+3. In this case, the combination of output 213 and output 214 is '11' indicating to controller 295 that ref_1 and ref_2 are to be decreased for the next sample. It should be noted that while FIG. 2b depicts the spacing between ref_1 and ref_2 to be constant, that this is not necessarily required.

The process described in relation to FIG. 2 of adjusting ref_1 and ref_2 is referred to herein as "virtual reference level shifting". It should be noted that while only two comparators are depicted in dynamic analog to digital converter 200, that more than two comparators may be included with a corresponding increase in reference voltages. In this case, rather than physically adjusting the reference voltages, fixed reference voltages are applied to a larger number of comparators. In this situation, as more fully described in the previously incorporated US patent application entitled "Analog-To-Digital Converter", the controller is responsible for selecting a subset of the comparators to enable, while the other comparators are disabled. Such an approach reduces power dissipation when compared with a flash analog to digital converter, but may still require a similar area to that of the flash analog to digital converter. Such an approach is referred to herein as "physical reference level shifting", and may be used in relation to different embodiments of the present invention.

As will be appreciated by one of ordinary skill in the art based on the disclosure provided herein, the analog to digital conversion approach discussed in relation to FIG. 2 provides a reasonably accurate digital representation of an analog input that varies slowly between bit periods without the power dissipation costs of a traditional flash analog to digital converter. Of note, however, during transitional periods, the ability of dynamic analog to digital converter 200 to provide a correct digital representation of analog input 205 degrades. Further, as more fully discussed in the previously incorporated US patent application entitled "Analog-To-Digital Converter", for dynamic analog to digital converter 200 to assign a correct value to each sample of analog signal 205, the difference between reference levels (i.e., ref_1–ref_2) must be less than the minimum change between two consecutive bit periods of analog input 205 that represents a transition in the transmitted bit sequence (i.e., a transition from '0' to '1' or from '1' to '0'). Such small transitions, referred to herein as "runt pulses", are common in communication systems due to high frequency attenuation, noise, crosstalk and/or inter-symbol interference. Where the difference between ref_1 and ref_2 is greater than a runt pulse, dynamic analog to digital converter 200 may not be capable of detecting the pulse resulting in the loss of a particular bit sequence. Conversely, the difference between ref_1 and ref_2 must be greater than any noise pulses induced on analog signal 205 due to high frequency attenuation, noise, crosstalk and/or inter-symbol interference between successive bit periods. Where the difference between ref_1 and ref_2 is less than a noise pulse, dynamic analog to digital converter 200 may detect the spurious noise pulse and improperly add an extraneous transition in the detected bit sequence.

Figure 3A:
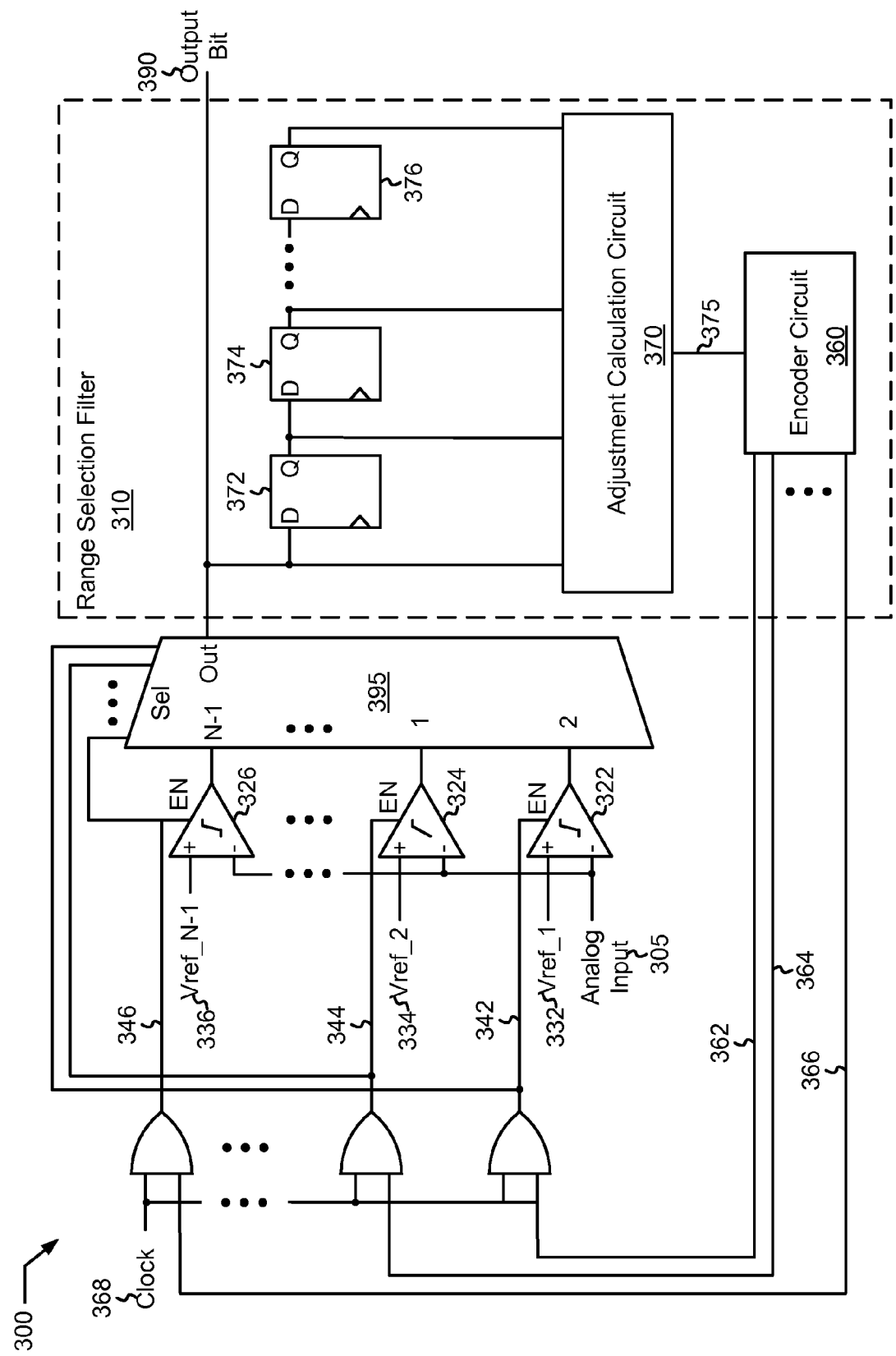
FIG. 3a depicts a dynamic analog to digital converter including range selection filtering in accordance with various embodiments of the present invention.

Various embodiments of the present invention incorporate range selection filtering to increase the accuracy of an output sequence of a dynamic analog to digital converter. Turning to FIG. 3a, a dynamic analog to digital converter 300 including a range selection filter 310 (shown in dashed lines) is depicted in accordance with various embodiments of the present invention. Dynamic analog to digital converter 300 includes a number of comparators 322, 324, 326 that each receive a respective voltage reference 332, 334, 336 distributed across an input range of dynamic analog to digital comparator 300. When enabled, comparators 322, 324, 326 each compare their respective voltage reference with an analog input 305. A particular subset of comparators 332, 334, 336 is enabled during a given bit period by respective ones of bit enables 342, 344, 346. Bit enables 342, 344, 346 are asserted for a clock period by logically ANDing enable signals 362, 364, 366 provided from an encoder circuit 360 with a clock signal 368. By selectively asserting bit enables 342, 344, 346, a particular input range for dynamic analog to digital converter 300 may be selected. The non-selected comparators remain in an idle state allowing for the conservation of power. As dynamic analog to digital converter 300 operates by selecting different subsets of comparators to shift the active input range, it is a physical level shifting analog to digital converter. In addition, bit enables 342, 344, 346 are provided to a multiplexer 395 that provides an output bit 390 to be driven by the selected comparator. It should be noted that while FIG. 3a depicts three comparators and associated circuits and signals, that any number of comparators and associated circuits and signals are possible in accordance with different embodiments of the present invention.

Range selection filter 310 includes a shift register formed of a number of flip-flops 372, 374, 376. In particular, flip-flop 372 receives output bit 390 synchronized to a clock signal (not shown) and flip-flop 374 receives the output of flip-flop 372 synchronized to the same clock signal. The output of flip-flop 374 is provided to a succeeding flip-flop, and flip-flop 376 receives the output of a preceding flip-flop synchronized to the same clock signal. The outputs of flip-flops 372, 374, 376 are provided to an adjustment calculation circuit 370 that calculates an adjustment to the input range for dynamic analog to digital converter 300 based at least in part on a portion of a previously received data pattern. An adjustment output 375 of adjustment calculation circuit 370 is provided to encoder circuit 360 that encodes adjustment output 375 to produce enable signals 362, 364, 366. As previously discussed, enable signals 362, 364, 366 are ultimately operable to select a particular subset of comparators 322, 324, 326 and thus to dynamically select the input range of dynamic analog to digital converter 300. As enable signals 362, 364, 366 are at least partially controlled by a portion of a received data set, dynamic analog to digital converter 300 is capable of using a received data stream to predict a desired input range of a subsequent bit period. In some embodiments of the present invention, range selection filter 310 is designed such that the period from selecting an input range and providing output bit 390 for one bit period through selecting a subsequent input range can be completed within a single period of clock signal 368. Based on the disclosure provided herein, one of ordinary skill in the art will recognize a variety of adjustment calculation circuits that may be used in accordance with different embodiments of the present invention to utilize data dependencies in selecting an appropriate input range for a succeeding bit period.

In some embodiments of the present invention, range selection filter 310 is a Decision Feedback Equalization (DFE) circuit that is used to adjust for data dependent noise that would otherwise degrade the performance of dynamic analog to digital converter 300. A DFE circuit is a Finite Impulse Response (FIR) filter with taps that correspond to the value of the impulse response of a channel during defined bit periods.

Figure 4:
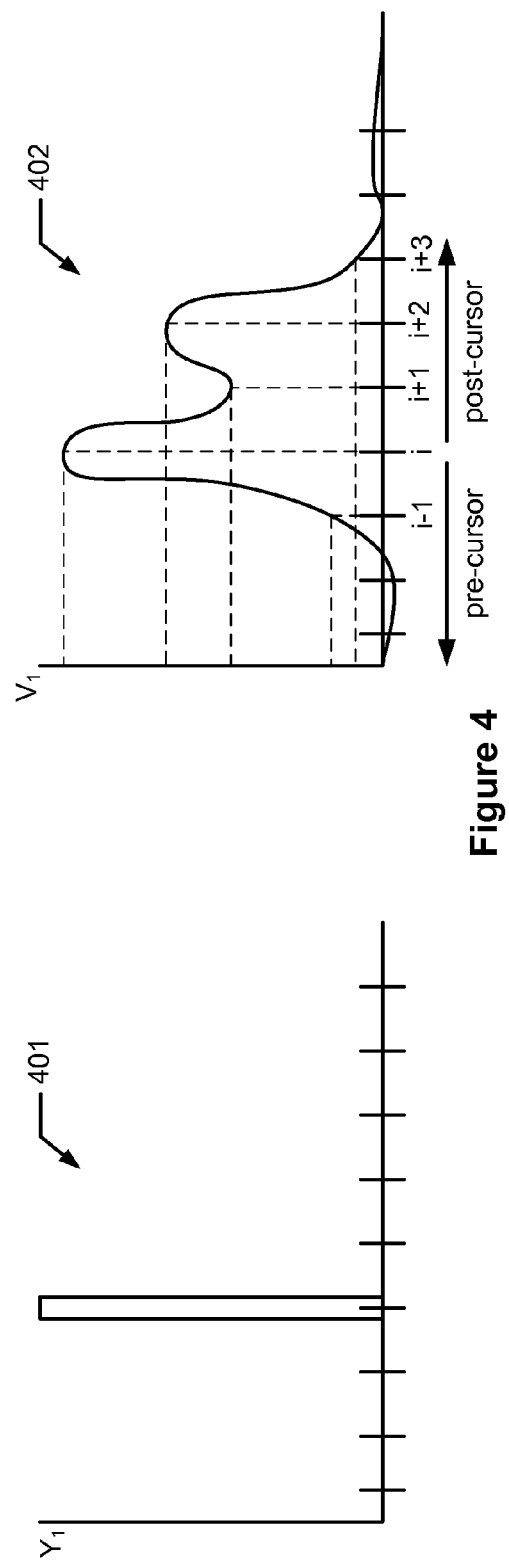
FIG. 4 depicts an exemplary pulse applied to a channel, and a channel response to that pulse.

Turning to FIG. 4, an exemplary pulse 401 applied to a channel, and a channel response 402 thereto are depicted. C(i) indicates the magnitude of the impulse response (i.e., cursor); C(i−1) indicates the pre-cursor inter-symbol interference at a bit period i−1; and C(i+1), C(i+2) and C(i+3) indicate post-cursor inter-symbol interference at bit periods i+1, i+2 and i+3, respectively. From this, it is understood that an analog input signal representing a bit value during bit period i will interfere with the analog input signal during the previous bit period i−1, and during subsequent bit periods i+1, i+2 and i+3. Accordingly, the analog input signal during bit periods i−1, i+1, i+2 and i+3 bit periods will interfere with the analog input signal during bit period i. Thus, to compensate for inter-symbol interference, inter-symbol interference values corresponding to the aforementioned bit periods can be summed and subtracted from the analog input signal during bit period i. The sum of the relevant inter-symbol interference values is referred to herein as an adjustment factor. In general, the adjustment factor can be found by multiplying the sampled bit value (logic '0' or logic '1') determined during relevant bit periods with the respective coefficient found from the impulse response. The adjusted analog input signal is then be sampled using a comparator. This process may be used to determine the correct logic value of a sample of an analog input signal in the presence of inter-symbol interference.

Figure 5:
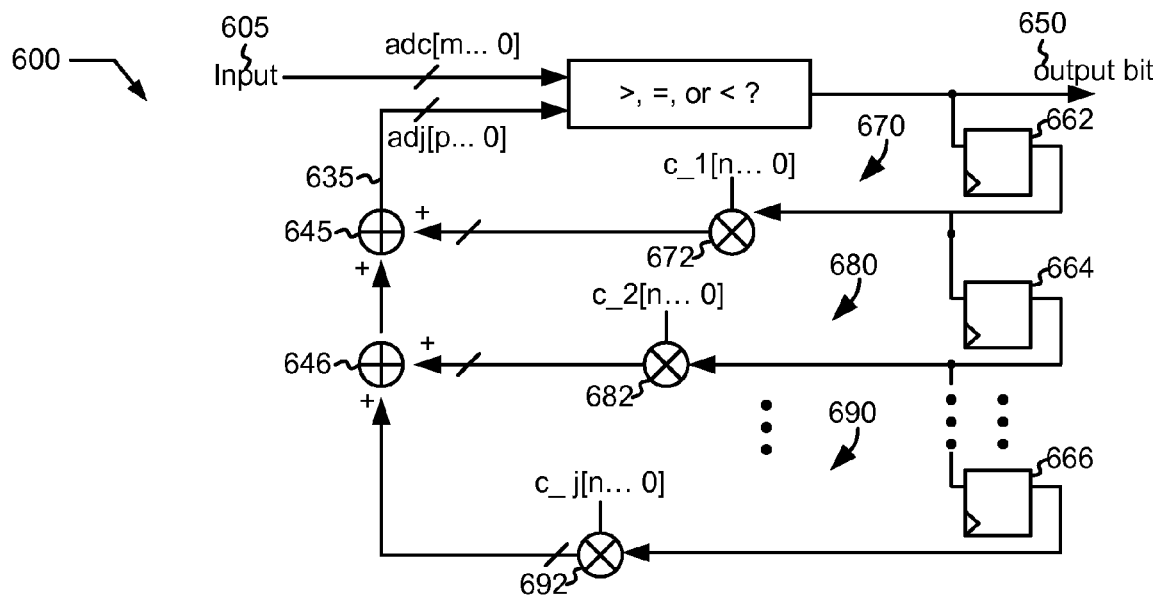
FIG. 5 depicts an exemplary digital DFE that may be modified for use in relation to some embodiments of the present invention.

In some cases, range selection filter 310 is designed to mitigate post-cursor inter-symbol interference as described in FIG. 4. FIG. 5 depicts an exemplary digital DFE circuit 600 that is capable of mitigating the aforementioned interference. Digital DFE circuit 600 is used to describe the interaction of flip-flops 372, 374, 376 and adjustment calculation circuit 370 of FIG. 3a. In particular, digital DFE circuit 600 may be modified to perform the function of flip-flops 372, 374, 376 and adjustment calculation circuit 370, and thus to perform the function of range selection filter 310 along with encoder circuit 360. As more fully explained below, the comparison function of digital DFE circuit 600 may be eliminated, and the mathematical functions may be implemented using pre-computation methods and lookup tables as are known in the art. Such modifications allow digital DFE circuit 600 to operate at speeds comparable to its analog counterpart, but without the demands for power and area exhibited by the analog counterpart.

As shown, digital DFE circuit 600 receives a digital input 605 (i.e., adc[m . . . 0]) at a digital comparison circuit 640 that is operable to compare digital input 605 with an adjustment factor 635 (i.e., adj[p . . . 0]), and provides an output bit 650. Digital comparison block 640 is often a limiting factor in using a digital DFE as it can require multiple layers of logic to perform its comparison. As more fully described below, by incorporating digital DFE 600 into dynamic analog to digital converter 300, digital comparison circuit 640 can be eliminated. This facilitates the completion of a range shift within one cycle of clock signal 368. Output bit 650 is fed to a shift register including a number (j) of flip-flops 662, 664, 666. The outputs of flip-flops 662, 664, 666 are used in respective feedback paths 670, 680, 690 where the respective output is multiplied by an inter-symbol interference value associated with the particular bit time. In particular, a feedback path 670 includes a digital multiplier 672 that multiplies the output of flip-flop 662 by an n-bit digital representation of the inter-symbol interference value corresponding to bit time i+1 (i.e., c1(n . . . 0)); feedback path 680 includes a digital multiplier 682 that multiplies the output of flip-flop 664 by an n-bit representation of the inter-symbol interference value corresponding to bit time i+2 (i.e., c2(n . . . 0)); and feedback path 690 includes a digital multiplier 692 that multiplies the output of flip-flop 666 by an n-bit representation of the inter-symbol interference value corresponding to bit time i+j (i.e., cj(n . . . 0)). The resulting products from digital multipliers 672, 682, 692 are summed using digital adder circuits 695, 696 to create adjustment factor 635. It should be noted that a number (k) of pre-cursor inter-symbol interferences can be mitigated in similar fashion by delaying the sampled analog input by k bit periods and including k corresponding feed forward paths to the exiting j feedback paths. Such an analog DFE circuit has and advantage of space and power consumption over a corresponding analog DFE circuit.

Further, the traditional timing limits of digital DFE circuit 600 can be reduced through integration into dynamic analog to digital converter 300. In particular, digital comparison block 640 determines whether the output of dynamic analog to digital converter 300 is less than, greater than, or equal to an adjustment factor. The following pseudocode demonstrates the function of the digital comparison block 640:

```
If ((adc[m . . . 0]−adj[p . . . 0])<=0)
{
   Output Bit=0
}
Else If ((adc[m . . . 0]−adj[p . . . 0])>0)
{
   Output Bit=1
}
```

Of note, the forgoing comparison is identical to performing a direct comparison of adc[m . . . 0] with adj[p . . . 0]. Thus, adjustment factor 635 can be used directly to select which subset of comparators 322, 324, 326 are to be activated during a subsequent bit period. This circumvents the need for digital comparison circuit 640 and reduces adjustment calculation circuit 370 to a set of digital multiplier circuits (corresponding to multipliers 672, 682, 692) that multiply the outputs of flip-flops 372, 374, 376 by their respective inter-symbol interference values (corresponding to c1, c2, cj), and a set of digital adder circuits (corresponding to digital adder circuits 695, 696). The output of the aforementioned digital adder circuits can be used as adjustment factor 375. It should be noted that in some cases, the aforementioned digital multiplier circuits and digital adder circuits may be eliminated through the use of well known methods of pre-computing the products and summation via a look-up table. This further enhances the speed of range selection filter 310. Encoder circuit 360 may be a 1-hot encoder that asserts only one of enables 362, 364, 366 during any bit period, and thereby selects only a single comparator of comparators 322, 324, 326 for use during the subsequent bit period as controlled by ANDing enables 362, 364, 366 with clock signal 368.

Figure 3B:
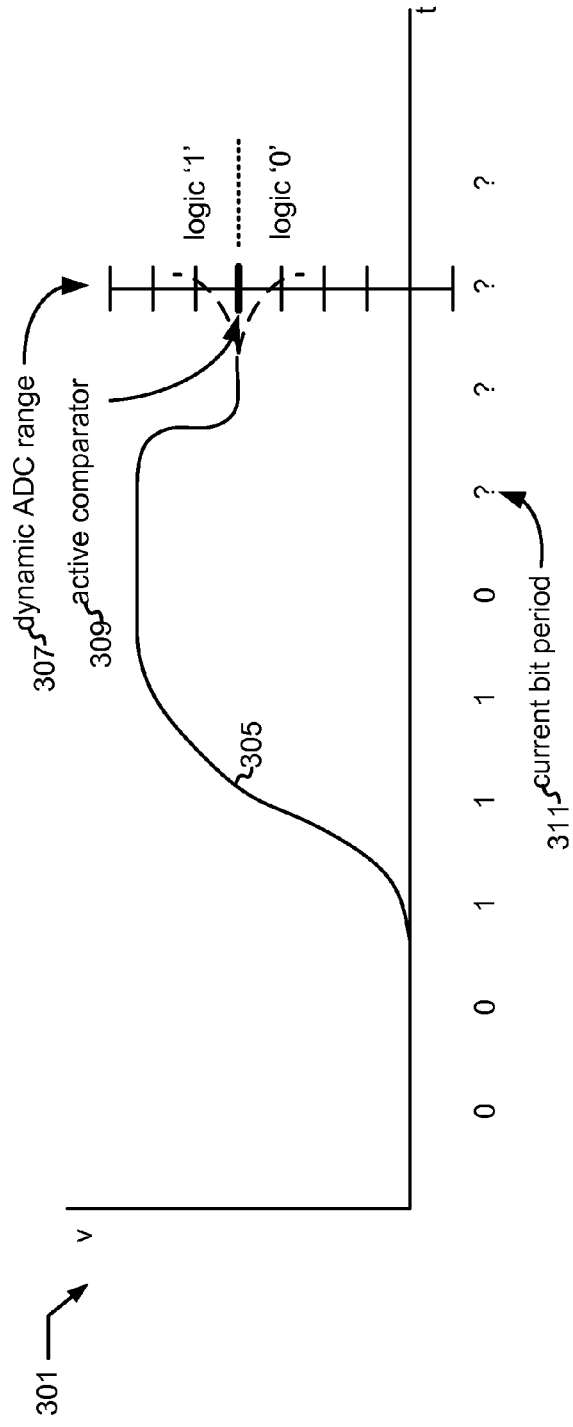

Turning to FIG. 3b, a timing diagram 301 depicts an exemplary operation of dynamic analog to digital converter 300. Following timing diagram 301, analog input 305 varies over time though a number of preceding bit periods. A dynamic ADC range 307 represents the range over which dynamic analog to digital converter 300 operates with each of the hash marks representing a comparator that may be selected for comparison with analog input 305. Each of the preceding bit periods produces a single bit that is provided as output bit 390. One or more of the values from the preceding bit periods are stored in flip-flops 372, 374, 376, and are used by adjustment calculation circuit 370 to select the comparator (i.e., active comparator 309) for use in a current bit period 311. During current bit period 311, analog input 305 is compared using the selected comparator and associated voltage reference. Where analog output 305 exceeds the voltage reference associated with the selected comparator, output bit 390 is a logic '1'.

Conversely, where analog output 305 is less than or equal to the voltage reference, output bit 390 is a logic '0'.

Among other advantages, embodiments of the present invention providing analog to digital conversion through unification of a dynamic analog to digital converter with a modified digital DFE circuit provide for a substantial reduction in power dissipation where only a single comparator is active during a given bit period. This is compared with traditional analog to digital converters that use a number of active comparators to provide a thermometer code that is then typically transformed into a more compact representation using, for example, a multiplexer tree or other encoding technique. In addition to the power dissipation incurred by using a number of active comparators, the aforementioned transformation process can be hardware intensive and suffer from a variety of latency problems. In addition, some embodiments of the present invention provide an ability to more accurately select a reference range in a dynamic analog to digital converter through use of a range selection filter.

Figure 6:
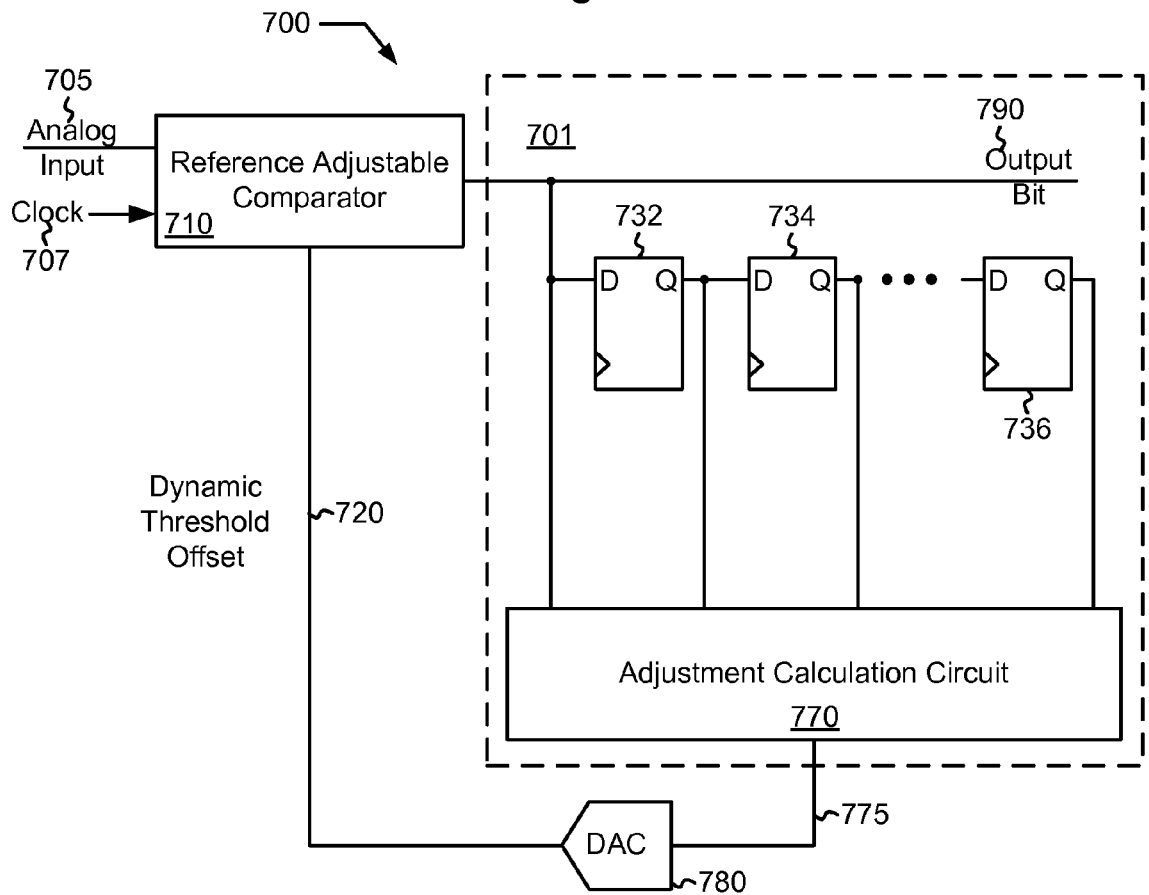
FIG. 6 depicts another dynamic analog to digital converter including range selection filtering in accordance with other embodiments of the present invention.

Turning to FIG. 6, another dynamic analog to digital converter 700 is including range selection filtering is depicted in accordance with other embodiments of the present invention. In contrast to dynamic analog to digital converter 300, dynamic analog to digital converter 700 uses physical reference level shifting to select a range around which an analog input 705 is compared. Dynamic analog to digital converter 700 receives analog signal 705 at a reference adjustable comparator 710. Reference adjustable comparator 710 may include a single comparator receiving both analog input 705 and a voltage reference offset by a dynamic threshold offset 720. When a clock signal 707 is asserted, the comparator provides an output bit 790 that reflects the comparison of analog input 705 with the offset reference voltage according to the following pseudocode:

If (analog input>(reference voltage+dynamic threshold offset))
{
  Output Bit=1
}
Else If (analog input<=(reference voltage+dynamic threshold offset))
{
  Output Bit=0
}

Output bit 790 is provided to a range selection filter 701 (shown in dashed lines) that uses various instances of output bit 790 to predict a desirable physical reference level shift for the succeeding bit period. In particular, range selection filter 701 includes a shift register formed of a number of flip-flops 732, 734, 736. In particular, flip-flop 732 receives output bit 790 synchronized to a clock signal (not shown) and flip-flop 734 receives the output of flip-flop 732 synchronized to the same clock signal. The output of flip-flop 734 is provided to a succeeding flip-flop, and flip-flop 736 receives the output of a preceding flip-flop synchronized to the same clock signal. The outputs of flip-flops 732, 734, 736 are provided to an adjustment calculation circuit 770 that calculates an adjustment to the input range for dynamic analog to digital converter 700 based at least in part on a portion of a previously received data pattern. An adjustment output 775 is provided to a digital to analog converter 780. Digital to analog converter 780 generates dynamic threshold offset 720 based on adjustment output 775.

As with dynamic analog to digital converter 300, dynamic analog to digital converter 700 may use a DFE like approach to implement range selection filter 701. For example, a digital DFE without a comparison block and having pre-computation and lookup table capability may be used. It should be noted that in alternative embodiments, reference adjustable comparator 710 may include more than one comparator each comparing analog input 705 with distinct voltage references offset by dynamic threshold offset 720. In such a case, output bit 790 would include a plurality of output bits that may be used in similar fashion to predict a reference level for a succeeding bit period.

Figure 7:
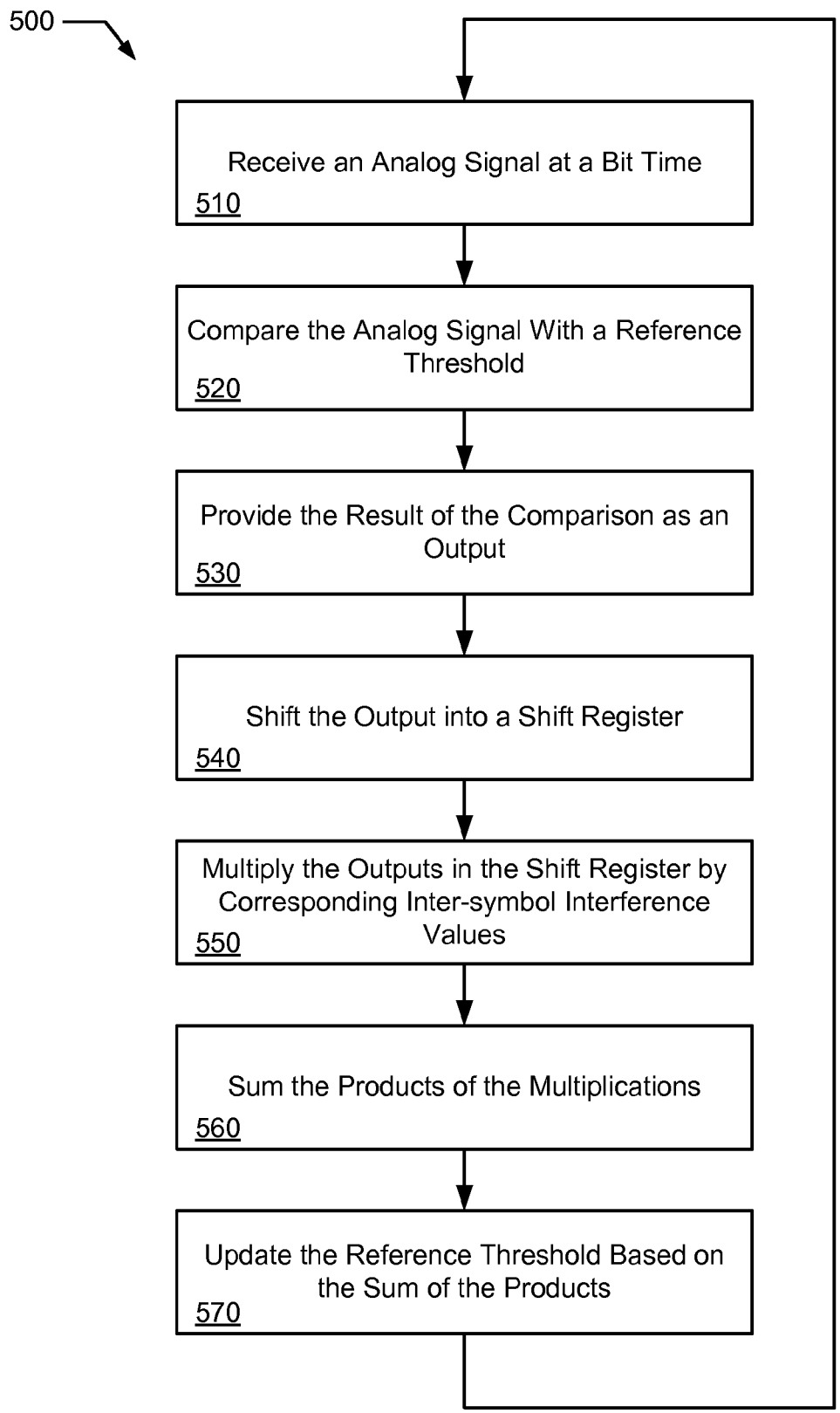
FIG. 7 is a flow diagram depicting a method for analog to digital conversion in accordance with various embodiments of the present invention.

Turning to FIG. 7, a flow diagram 500 depicts a method for analog to digital conversion in accordance with various embodiments of the present invention. Following flow diagram 500, an analog signal is received at a bit time (i) (block 510). The analog signal is compared against a reference threshold (block 520), and a result of the comparison is provided as an output (block 530). In addition, the output is stored to a shift register, and prior outputs are shifted down into the shift register (block 540). The outputs maintained in the shift register are each multiplied by a inter-symbol interference value corresponding to the bit time of the particular output (block 550). The products of the preceding multiplication process (block 550) are aggregated (block 560). The multiplication and aggregation processes may be performed using pre-computed values retrieved from a lookup table, through use of dedicated multiplication and summation circuitry, or some combination thereof. The sum of the products is provided as an adjustment factor that may then be used to update the reference threshold (block 570). Updating the reference threshold may be done through physical reference level shifting or virtual reference level shifting depending upon the particular implementation. The process is then repeated for a subsequent bit time (i+1).

Figure 1:
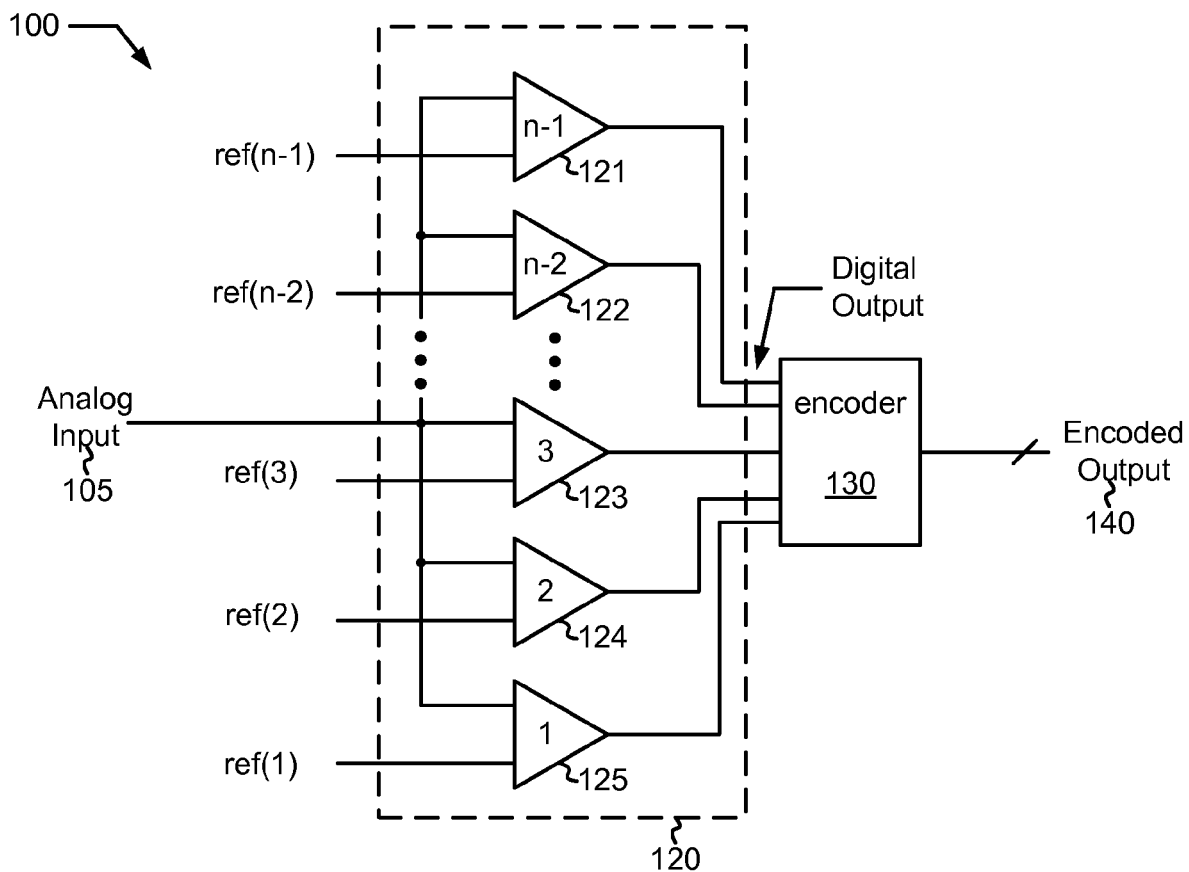
FIG. 1 depicts a prior art flash analog to digital converter.
Figure 8:
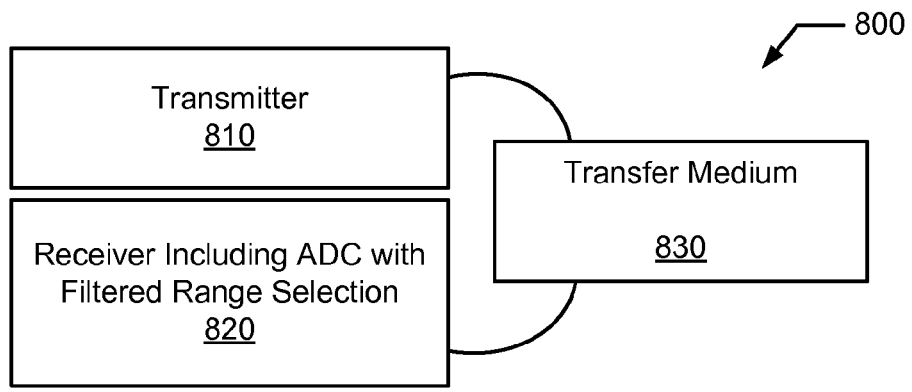
FIG. 8 depicts a communication system including a dynamic analog to digital converter including range selection filtering in accordance with some embodiments of the present invention.

Turning to FIG. 8, a communication system 800 including a receiver 820 with a dynamic analog to digital converter incorporating range selection filtering is shown in accordance with some embodiments of the present invention. Communication system 800 includes a transmitter 810 that transmits a signal representing a data set to receiver 820 via a transfer medium 830. Transfer medium 830 may be, but is not limited to, a wireless transfer medium, a electrically wired transfer medium, a magnetic storage medium, or an optical transfer medium. Based on the disclosure provided herein, one of ordinary skill in the art will recognize a variety of transfer media that may be used in relation to different embodiments of the present invention. Receiver 820 includes a dynamic analog to digital converter incorporating a filterer range selection circuit similar to those described above in relation to FIG. 3*a* and FIG. 6. In some cases, communication system 800 may be a cellular telephone system with transmitter 810 and receiver 820 being cell phones and/or cell towers. Alternatively, communication system 800 may be a magnetic storage medium with transmitter 810 being a write function, transfer medium 830 being a magnetic storage medium, and receiver 820 being a read function. Based on the disclosure provided herein, one of ordinary skill in the art will recognize a variety of other systems that may be represented as communication system 800 in accordance with different embodiments of the present invention.

In conclusion, the invention provides novel systems, devices, methods and arrangements for analog to digital conversion. While detailed descriptions of one or more embodiments of the invention have been given above, various alternatives, modifications, and equivalents will be apparent to those skilled in the art without varying from the spirit of the invention. For example, while different embodiments of the present invention have been depicted with a particular number of taps and/or levels of interleaving, it will be understood that an arbitrary number of taps and/or interleaves may be supported in accordance with different embodiments of the present invention. Therefore, the above description should not be taken as limiting the scope of the invention, which is defined by the appended claims.

What is claimed is:

1. An analog to digital conversion circuit, the circuit comprising:
   an analog input operable to receive an analog signal;
   a comparator bank operable to receive a variable reference threshold corresponding to a reference indicator, the comparator bank including a single comparator for comparing the variable reference threshold with the analog signal, wherein the single comparator is operable to provide a current output varying from a maximum output to a minimum output of the analog to digital conversion circuit; and
   a range selection filter that is operable to receive the current output and to generate a reference indicator based at least in part on a prior output of the comparator bank.

2. The circuit of claim 1, wherein the reference indicator is used by an adjustment calculation circuit to generate a voltage offset, and wherein the variable reference threshold is a reference voltage plus the voltage offset.

3. The circuit of claim 2, wherein the reference voltage is zero.

4. The circuit of claim 1, wherein the range selection filter includes a storage device for storing the prior output of the comparator bank, and wherein the range selection filter further includes an adjustment calculation circuit that is operable to receive the prior output and to calculate an adjustment factor based at least in part on the prior output.

5. The circuit of claim 4, wherein the storage device is a shift register.

6. The circuit of claim 4, wherein the adjustment factor includes the prior output multiplied by an inter-symbol interference value corresponding to a bit period of the prior output.

7. The circuit of claim 6, wherein the bit period precedes a bit period of the current output.

8. The circuit of claim 6, wherein the bit period succeeds a bit period of the current output.

9. The circuit of claim 6, wherein the prior output is a first prior output, wherein the bit period is a first bit period, wherein the reference indicator is generated at least in part based on the first prior output and a second prior output of the comparator bank, wherein the storage device stores both the first prior output and the second prior output, and wherein the adjustment calculation circuit multiplies the first prior output by a first inter-symbol interference value corresponding to the first bit period and multiplies the second prior output by a second inter-symbol interference value corresponding to a second bit period, and wherein the adjustment factor includes a sum of the product of multiplying the first prior output by the first inter-symbol interference value and the product of multiplying the second prior output by the second inter-symbol interference value.

10. A method for analog to digital conversion, the method comprising:
   receiving an analog input at a comparator bank;
   comparing the analog input with a first reference threshold during a first bit period;
   determining a second reference threshold based at least in part on a result of comparing the analog input with the first reference threshold, wherein determining the second reference threshold includes multiplying the result of comparing the analog input with the first reference threshold by an inter-symbol interference value corresponding to the first bit period; and
   comparing the analog input with the second reference threshold during a second bit period.

11. The method of claim 10, wherein multiplying the result of comparing the analog input with the first reference threshold by the inter-symbol interference value corresponding to the first bit period is done by looking up a pre-computed value in a lookup table.

12. The method of claim 10, wherein the method further comprises:
   determining a third reference threshold based at least in part on the result of comparing the analog input with the first reference threshold and the result of comparing the analog input with the second reference threshold;
   wherein determining the third reference threshold includes:
   multiplying the result of comparing the analog input with the first reference threshold by an inter-symbol interference value corresponding to the first bit period to generate a first product;
   multiplying the result of comparing the analog input with the second reference threshold by an inter-symbol interference value corresponding to the second bit period to generate a second product; and
   summing the first product and the second product; and
   comparing the analog input with the third reference threshold during a third bit period.

13. The method of claim 12, wherein multiplying the result of comparing the analog input with the first reference threshold by an inter-symbol interference value corresponding to the first bit period to generate a first product, multiplying the result of comparing the analog input with the second reference threshold by an inter-symbol interference value corresponding to the second bit period to generate a second product, and summing the first product and the second product is done by looking up a pre-computed value in a lookup table.

14. The method of claim 10, wherein comparing the analog input with the first reference and comparing the analog input with the second reference is done though use of a process selected from a group consisting of: virtual reference level shifting, and physical reference level shifting.

15. An analog to digital conversion circuit, the circuit comprising:
   an analog input operable to receive an analog signal;
   a comparator bank that is operable to receive a reference indicator, the comparator bank being operable to provide a current output based at least in part on a comparison of the analog input with a reference threshold corresponding to the reference indicator; and
   a range selection filter that includes a storage device for storing a prior output of the comparator bank; wherein the range selection filter further includes an adjustment calculation circuit that is directly coupled to the storage device, is operable to receive the prior output and to calculate the reference indicator based at least in part on the prior output.

16. The circuit of claim 15, wherein the reference indicator includes the prior output multiplied by an inter-symbol interference value corresponding to a bit period of the prior output.

17. The circuit of claim 16, wherein the bit period precedes a bit period of the current output.

18. The circuit of claim 16, wherein the bit period succeeds a bit period of the current output.

19. The circuit of claim 16, wherein the prior output is a first prior output, wherein the bit period is a first bit period, wherein the reference indicator is generated at least in part based on the first prior output and a second prior output of the comparator bank, wherein the storage device stores both the first prior output and the second prior output, and wherein the range selection filter multiplies the first prior output by a first inter-symbol interference value corresponding to the first bit period and multiplies the second prior output by a second inter-symbol interference value corresponding to a second bit period.

20. The circuit of claim 15, wherein the comparator bank includes at least a first comparator associated with a first reference threshold and a second comparator associated with a second reference threshold, and wherein the reference indicator is a selector that selects comparison of the analog input with the first reference threshold by the first comparator during a first bit period and selects comparison of the analog input with the second reference threshold by the second comparator during a second bit period.

21. The circuit of claim 20, wherein the current output corresponds to the output of the first comparator during the first bit period and corresponds to the output of the second comparator during the second bit period.

22. The circuit of claim 20, wherein the first comparator is disabled during the first bit period, and wherein the second comparator is disabled during the second bit period.

23. An analog to digital conversion circuit, the circuit comprising:
   an analog input operable to receive an analog signal;
   a comparator bank operable to receive a reference indicator, and to provide a current output based at least in part on a comparison of the analog input with a reference threshold corresponding to the reference indicator; and
   a range selection filter including a storage device for storing a prior output of the comparator bank; the range selection filter further including an adjustment calculation circuit that is directly coupled to the storage device, is operable to receive the prior output and is operable to calculate an adjustment factor based at least in part on the prior output; the adjustment factor including the prior output multiplied by an inter-symbol interference value corresponding to a bit period of the prior output.

24. The circuit of claim 23, wherein the bit period precedes a bit period of the current output.

25. The circuit of claim 23, wherein the bit period succeeds a bit period of the current output.

26. The circuit of claim 23, wherein the prior output is a first prior output, wherein the bit period is a first bit period, wherein the reference indicator is generated at least in part based on the first prior output and a second prior output of the comparator bank, wherein the storage device stores both the first prior output and the second prior output, and wherein the adjustment calculation circuit multiplies the first prior output by a first inter-symbol interference value corresponding to the first bit period and multiplies the second prior output by a second inter-symbol interference value corresponding to a second bit period, and wherein the adjustment factor includes a sum of the product of multiplying the first prior output by the first inter-symbol interference value and the product of multiplying the second prior output by the second inter-symbol interference value.

* * * * *